(12) United States Patent
Ryan et al.

(10) Patent No.: US 6,281,652 B1
(45) Date of Patent: Aug. 28, 2001

(54) METHOD OF USING TWO LOW-RESOLUTION DACS FOR CONVERTING HIGH-RESOLUTION DIGITAL DEMANDS INTO ANALOG OUTPUT SIGNALS THAT MONOTONICALLY DRIVE AN ACTUATOR MOTOR IN A DISK DRIVE

(75) Inventors: Robert P. Ryan; George S. Bouchaya, both of Mission Viejo, CA (US)

(73) Assignee: Western Digital Corporation, Lake Forest, CA (US)

( * ) Notice: Subject to any disclaimer, the term of this patent is extended or adjusted under 35 U.S.C. 154(b) by 0 days.

(21) Appl. No.: 09/536,067

(22) Filed: Mar. 24, 2000

(51) Int. Cl.[7] ............................ G05B 11/18; H03M 1/36; H03M 1/66; H03M 1/06
(52) U.S. Cl. ..................... 318/594; 318/595; 341/144; 341/141
(58) Field of Search ........................ 318/592, 604, 318/614, 666, 603, 593, 595, 467, 594, 653; 360/77, 75, 78.05; 369/32, 44.28, 33; 341/141, 162, 155, 152, 144, 145, 121, 131, 159, 118; 375/238

(56) References Cited

U.S. PATENT DOCUMENTS

| | | |
|---|---|---|
| 3,449,741 | 6/1969 | Egerton, Jr. . |
| 3,850,105 * | 11/1974 | Aronstein et al. . |
| 3,995,206 * | 11/1976 | Aronstein et al. . |
| 4,063,236 | 12/1977 | Amemiya et al. . |
| 4,149,200 * | 4/1979 | Card . |
| 4,149,201 * | 4/1979 | Card . |
| 4,375,636 | 3/1983 | Stack et al. . |
| 4,429,267 * | 1/1984 | Veale . |
| 4,599,547 * | 7/1986 | Ho . |
| 5,172,115 | 12/1992 | Kerth et al. . |
| 5,223,771 | 6/1993 | Chari . |
| 5,229,772 | 7/1993 | Hanlon . |
| 5,339,299 * | 8/1994 | Kagami et al. . |
| 5,444,582 | 8/1995 | Suzuki . |
| 5,444,583 | 8/1995 | Ehrlich et al. . |
| 5,446,371 | 8/1995 | Eccleston et al. . |
| 5,543,697 * | 8/1996 | Carobolante et al. . |
| 5,703,584 * | 12/1997 | Hill . |
| 5,721,648 | 2/1998 | Phan et al. . |
| 5,764,165 | 6/1998 | Buch . |
| 5,920,441 * | 7/1999 | Cunningham et al. . |
| 5,973,631 * | 10/1999 | McMullen et al. . |
| 5,977,898 * | 11/1999 | Ling et al. . |
| 5,990,815 * | 11/1999 | Linder et al. . |
| 6,052,076 * | 4/2000 | Patton, III et al. . |
| 6,114,980 * | 9/2000 | Tilley et al. . |
| 6,137,430 * | 10/2000 | Lyden et al. . |
| 6,198,419 * | 3/2001 | Wen . |
| 6,204,790 * | 3/2001 | Jin et al. . |

* cited by examiner

Primary Examiner—Paul Ip
(74) Attorney, Agent, or Firm—Milad G Shara

(57) ABSTRACT

Disclosed is a method in a disk drive that allows the functionality of a single high-resolution DAC to be replicated with a pair of lower-resolution DACs that are operated in a unique manner that provides monotonic behavior and reduces both differential and integral non-linearity. The two lower-resolution DACs take up substantially less space that one higher-resolution DAC when implemented in a semiconductor die. The method combines coarse values from one DAC with fine values from the other DAC to form a combined analog output signal within operational segments that collectively span a range of N-bit demands. The method operates such the operational segments overlap one another by 50 percent, with an endpoint of each operational segment ending near a center of an overlapped operational segment. The method's overlapping relationship tends to cause the combined analog output voltage to vary monotonically, by maintaining the X-bit command and only varying the Y-bit command whenever possible for small changes in the combined analog output signal.

34 Claims, 12 Drawing Sheets

METHOD OF USING TWO LOW-RESOLUTION DACS FOR CONVERTING HIGH-RESOLUTION DIGITAL DEMANDS INTO ANALOG OUTPUT SIGNALS THAT MONOTONICALLY DRIVE AN ACTUATOR MOTOR IN A DISK DRIVE

FIELD OF THE INVENTION

The present invention relates generally to magnetic disk drives and, more particularly, to a method of using two lower-resolution digital-to-analog converters (DACs) for converting higher-resolution digital demands into analog signals that monotonically drive an actuator motor in a disk drive.

BACKGROUND OF THE RELATED ART

FIG. 1 is a block diagram of certain portions of a disk drive that are relevant to the present invention. With reference to FIG. 1, it is well known that magnetic disk drives generally read and write data on the surface of a rotating magnetic disk with a transducer or head 81 that is located at the far end of a moveable actuator that is moved with a voice coil motor (VCM) 80. A sampled-data servo control system uses servo control information recorded amongst the data, or on a separate disk, to controllably move the actuator from track to track ("seeking") and to hold the actuator at a desired position ("track following"). It is unnecessary to provide a detailed discussion of the sampled servo control format, the servo control loop, or servo control systems in general because such systems are well known.

Of relevance to this invention, however, it can be seen in FIG. 1 that the control loop includes an N-bit digital-to-analog converter (DAC) 31' that is used to drive the VCM 80 via a suitable drive circuit 70'. In operation, the DAC 31' receives a coded value in the form of an N-bit demand and then produces an analog output signal having a magnitude corresponding to the value coded into the N-bit demand.

The particular system of FIG. 1 includes a controller 10 and a VCM driver chip 30' that are conventionally provided as separate elements. Other arrangements are possible, but it is important to note that, in order to accommodate the requisite power requirements, a coarser semiconductor fabrication technology is generally used to make the VCM driver chip 30' than is used to make the controller 10. As such, it is generally considered important to minimize the logic embedded within the VCM driver chip 30' because of costs associated with an increase in die size.

In general operation, the controller 10 outputs a sequence of N-bit demands to the DAC 31', over a serial interface 20, in accordance with host commands that are received from a host computer (not shown) and in accordance with sampled-servo information that was detected by a head 81 and communicated to the controller 10 via a channel 90.

Each N-bit demand in the sequence is coded (typically in the form of a binary code) to represent a demanded amount of current to flow through the actuator motor 80. The DAC 31' converts each N-bit demand into an analog output signal in the form of a voltage having a magnitude that corresponds to the N-bit demand. The drive circuit 70' suitably receives the analog output signal and controls the current in the coil of the actuator motor 80 accordingly.

The disk drive industry is highly competitive and manufacturers are continuously striving to increase areal density while reducing costs. One of the most common approaches to increasing areal density is to increase track pitch (tpi). In order to effectively track follow in the presence of more and more tightly packed tracks, however, it is necessary to provide finer and finer control of the VCM 80 with a higher resolution DAC. As an example, a 14-bit DAC is needed in order to provide the desired control resolution for contemporary areal density requirements.

Providing a 14-bit DAC on the VCM driver chip 30, however, uses a relatively large amount of die space as compared with a lower resolution DAC. Consuming more die space, of course, is contrary to the need to reduce costs.

There remains a need, therefore, to provide the higher resolution control needed to satisfy the market's ever increasing TPI requirements at a competitive cost.

SUMMARY OF THE INVENTION

In a first aspect, the invention resides in a method of converting a sequence of N-bit demands into analog output signals that drive an actuator motor in a magnetic disk drive using two lower-resolution digital-to-analog converters (DACs) including a first DAC of at least X-bits of resolution that produces a coarse output signal (where X<N) and a second DAC of at least Y-bits of resolution that produces a fine output signal (where Y<N), the method comprising the steps of: receiving a new N-bit demand derived from a range of N-bit demand values; converting the new N-bit demand into an X-bit command and a Y-bit command by: selecting the X-bit command corresponding to a prior N-bit demand if the new N-bit demand is near enough to the prior N-bit demand such that the new N-bit demand may be attained by re-using the X-bit command which corresponds to the prior N-bit demand and varying the Y-bit command; else selecting a new X-bit command, and subtracting (114) the selected X-bit command from the new N-bit demand to calculate a new Y-bit command; producing a coarse output signal with the first DAC based on the selected X-bit command; producing a fine output signal with the second DAC based on the calculated Y-bit command; and combining the coarse and fine output signals to produce the analog output signal that drives the actuator motor.

In a second aspect, the invention resides in a method of converting a sequence of N-bit demands into analog output signals that drive an actuator motor in a magnetic disk drive using two lower-resolution digital-to-analog converters (DACs) including a first DAC of at least X-bits of resolution that produces a coarse output signal (where X<N) and a second DAC of at least Y-bits of resolution that produces a fine output signal (where Y<N), the method comprising the steps of: (a) receiving a new N-bit demand derived from a range of N-bit demand values; (b) converting (120) the new N-bit demand into an X-bit command and a Y-bit command wherein X is equal to N−Y+1 such that there are $2^{N-Y+1}$ possible X-bit commands and $2^{N-Y+1}$ operational segments that are each defined by a locus of commands corresponding to one of the $2^{N-Y+}$ possible X-bit commands and a set of $2^Y$ Y-bit commands, the converting step including the sub-steps of: (i) selecting the X-bit command corresponding to a prior N-bit demand if the new N-bit demand is near enough to the prior N-bit demand such that the new N-bit demand may be attained by re-using the X-bit command that corresponds to the prior N-bit demand and varying the Y-bit command; else selecting (113) a new X-bit command, and (ii) subtracting the selected X-bit command from the new N-bit demand to calculate a Y-bit command; (c) producing a coarse output signal with the first DAC based on the selected X-bit command; (d) producing a fine output signal with the second DAC based on the calculated Y-bit command; (e) scaling the coarse and fine output signals into first and second scaled output signals by using first and second scaling factors that are provided in a ratio of $1:2^{N-Y}$ so that the $2^{N-Y+1}$ operational segments collectively span the range of N-bit demand values by successively overlapping one another by 50 percent, with an endpoint of each operational segment ending near a center of an overlapped operational segment; and (f) summing the first and second scaled output signals together to produce the analog output signal that drives the actuator motor.

BRIEF DESCRIPTION OF THE DRAWINGS

The just summarized invention can be best understood with reference to the following description taken in view of the drawings of which.

DETAILED DESCRIPTION OF THE PREFERRED EMBODIMENT

Figure 1:
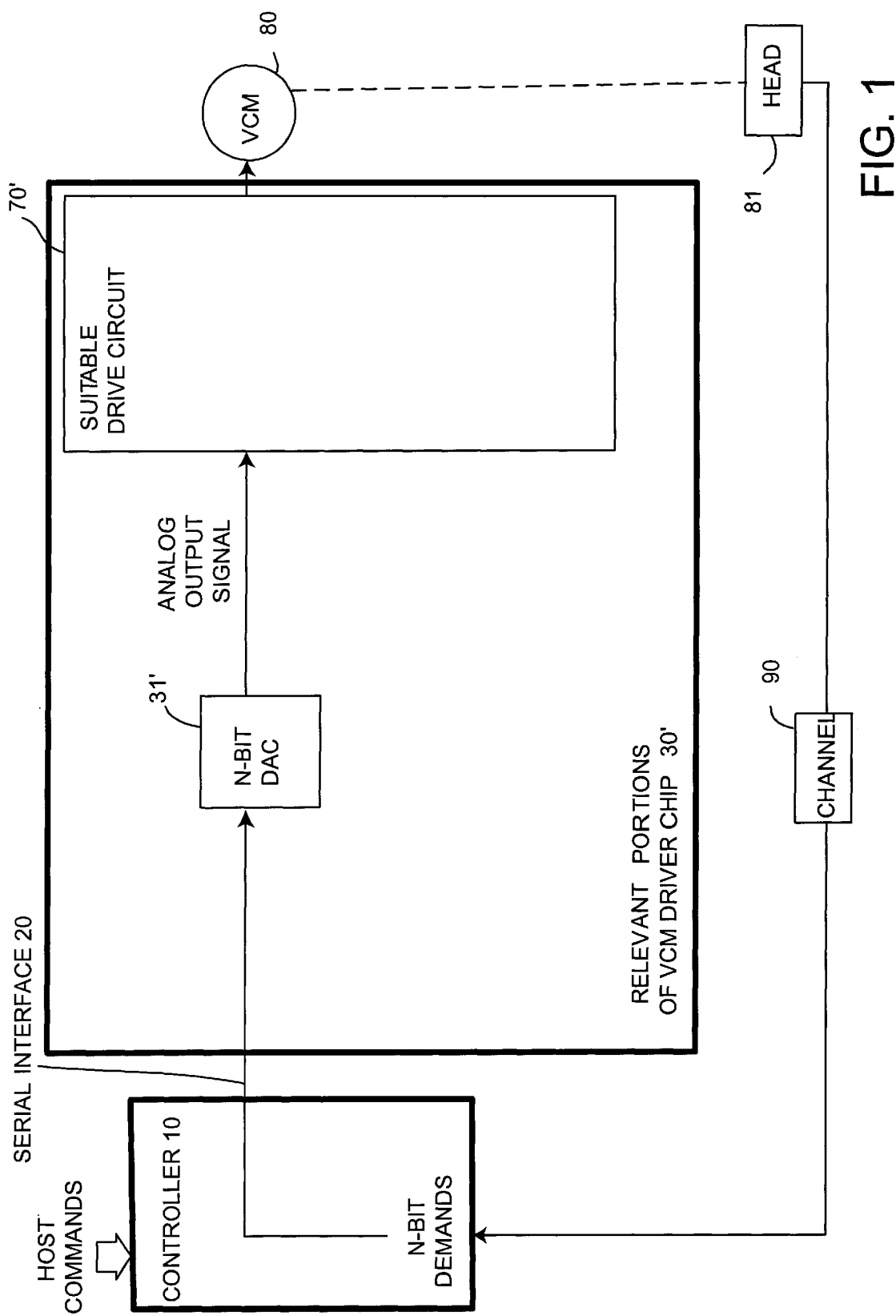
FIG. 1 is a block diagram of a representative control loop in which N-bit demands are provided to a single N-bit DAC for driving a VCM.

In the background section above, the single DAC 31' of FIG. 1 was hypothetically regarded as a 14-bit DAC. The method of this invention allows the functionality of a single DAC to be replicated with a pair of smaller, lower-resolution DACs that are operated in a unique manner that provides monotonic behavior and reduces both differential and integral non-linearity.

Figure 2:
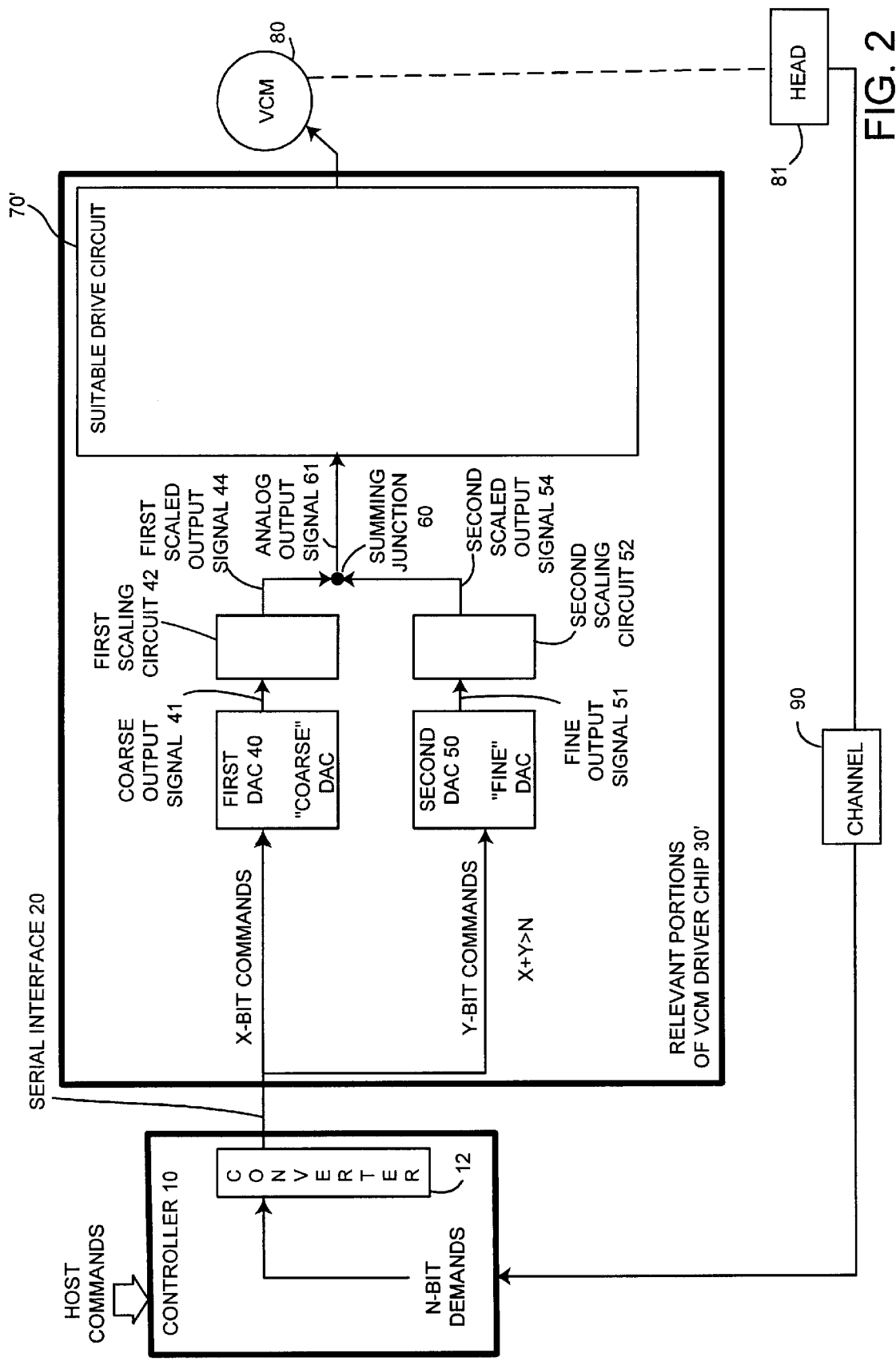
FIG. 2 is block diagram of a control loop that uses first and second DACs according to a preferred embodiment of this invention.

FIG. 2 is comparable to FIG. 1 in that it similarly shows a servo control loop formed from a controller 10, a serial interface 20, a VCM driver chip 30 (as opposed to 30'), a VCM 80 that moves an actuator (not shown) that carries a head 81, and a channel 90. In FIG. 2, however, the VCM driver chip 30 includes not one DAC, but two: (1) a first DAC 40 and (2) a second DAC 50. The first and second DACs 40, 50 are preferably resistor-string DACs, but the method of this invention may be implemented with DACs of any construction now known or later conceived of by those of ordinary skill in the art.

The VCM driver 30 of FIG. 2 further includes a first scaling circuit 42, a second scaling circuit 52, and a summing junction 60. During operation, the first DAC 40 outputs a first or "coarse" output signal 41 to the first scaling circuit 42 to produce a first scaled output signal 44. In like fashion, the second DAC 50 outputs a second or "fine" output signal 51 to the second scaling circuit 52 to produce a second scaled output signal 54. The first and second scaled output signals 44, 54 are thereafter combined at the summing junction 60 to produce an overall analog output signal 61 that is provided to a suitable drive circuit 70 that provides drive current to the VCM 80. It's also significant to note that the controller 10 of FIG. 2 includes a "converter" 12 that, as suggested by the figure, receives N-bit demands and converts them to X-bit and Y-bit commands that, with little or no modification, are suitable for provision to the first and second DACs 40, 50. The preferred converter 12 is formed from digital logic gates, but it could also be implemented in whole or part with a microprocessor and suitable firmware.

Figure 3:
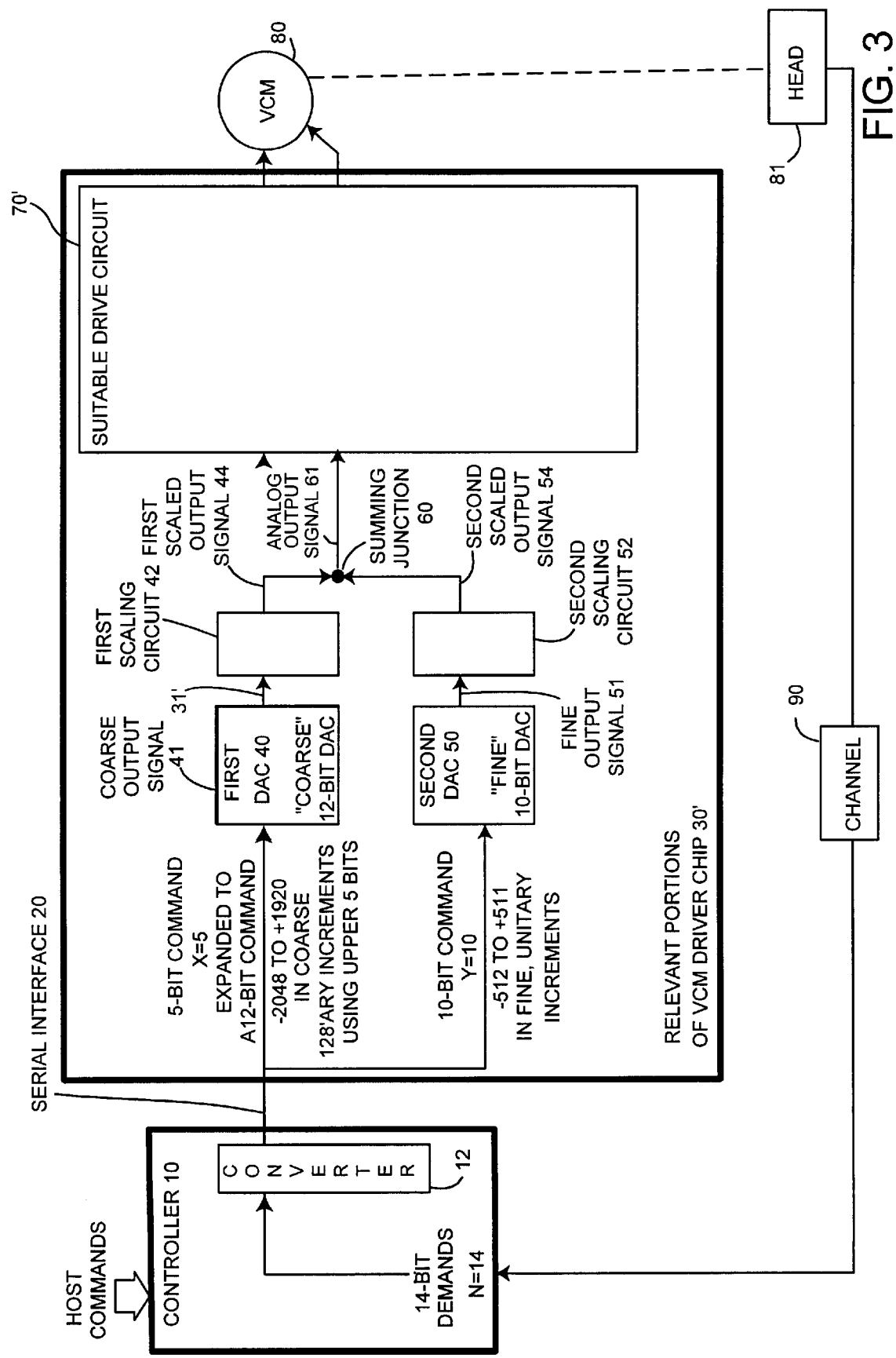
FIG. 3 is a block diagram that expands on FIG. 2 and provides details regarding the bit size of the demands and of the first and second DACs used in the preferred embodiment.

FIG. 3 adds some additional details beyond what is shown in FIG. 2 that relate to the numeric specifics of a presently preferred embodiment. In particular, as shown in the controller 10, the preferred embodiment operates with 14-bit demands (N=14) and, as shown by the commands that travel across the serial interface 20 to the VCM driver chip 30, parses such 14-bit demand words into a "coarse" 5-bit command (X=5) and a "fine" 10-bit command (Y=10).

The method, of course, could be used with a 5-bit DAC and a 10-bit DAC, but it can also be used with DAC's of higher than necessary resolution. As shown in the VCM driver chip 30 of FIG. 3, in fact, the first DAC has more than 5-bits of resolution. In particular, it has 12-bits of resolution (M≧X=12) and the second DAC 50 has exactly 10-bits of resolution (=Y). Great efficiencies are achieved even though M>5. In particular, since a 12-bit DAC is about $¼^{th}$ the size of a 14-bit DAC and a 10-bit DAC is about $⅟_{16}^{th}$ the size of a 14-bit DAC, the unique method of this invention uses only about $⅗_{16}^{th}$ of the die area of a 14-bit DAC while providing the same 14-bits of resolution, all while maintaining operational stability and substantial monotonicity even though the two DAC's require an occasional switch from "segment" to "segment" as discussed below.

Figure 5:
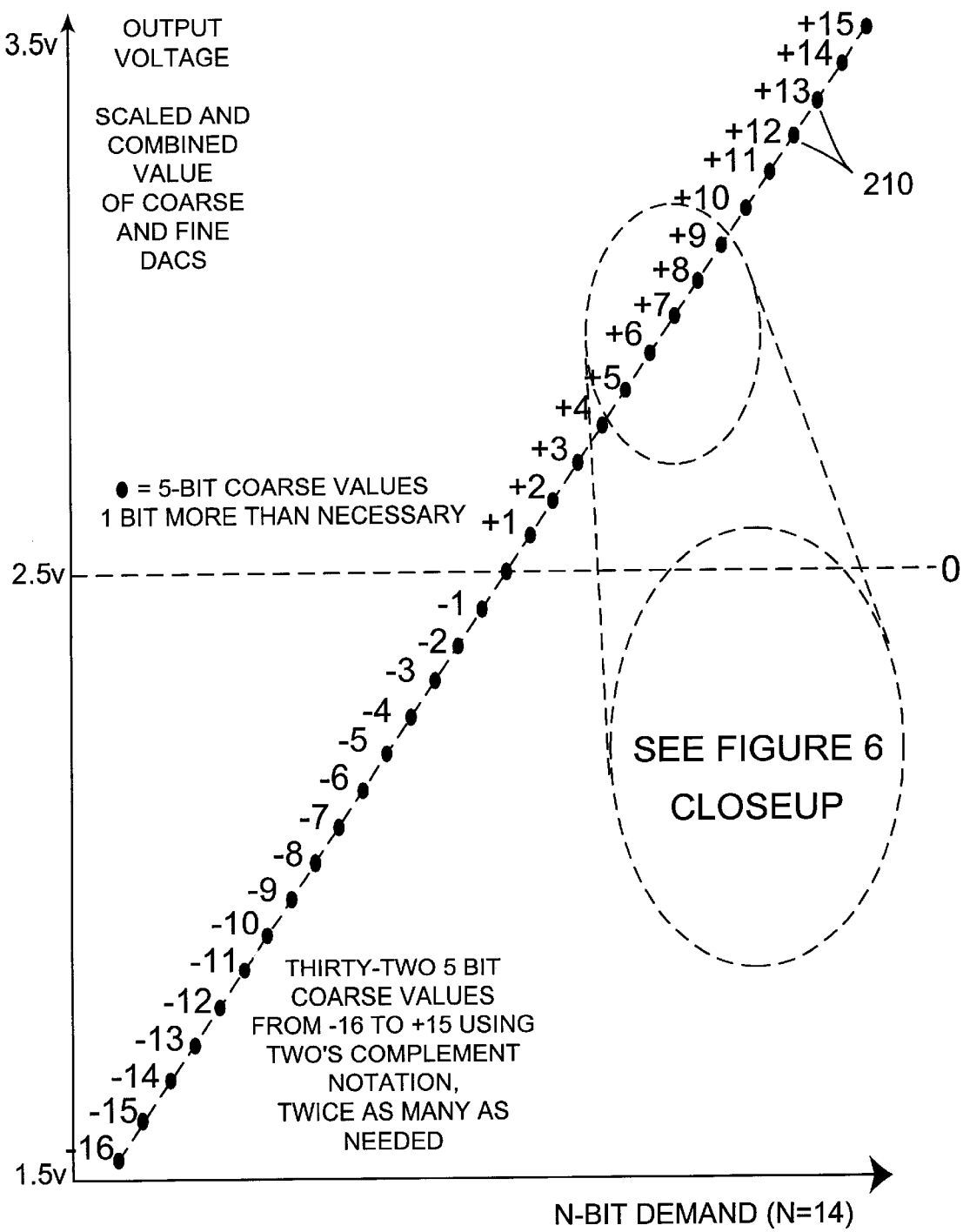
FIG. 5 is a graph showing output voltage as a function of the N-bit demand, the selected output voltage being defined by one of a plurality of X-bit coarse values and one of a plurality of Y-bit fine values that adjusts up or down relative to the coarse value within an "operational segment"
Figure 6:
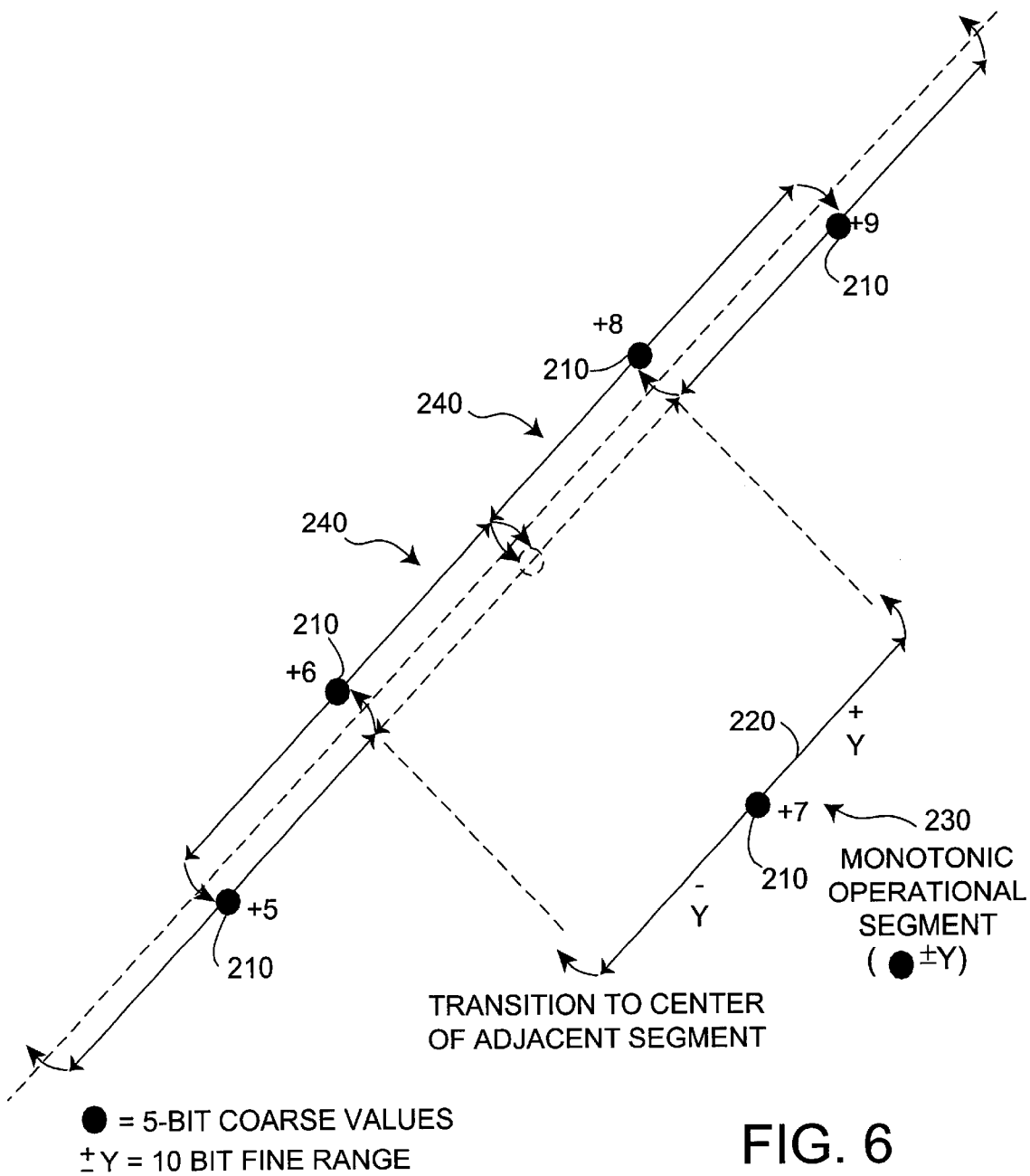
FIG. 6 is a close-up of a portion of the graph of FIG. 5, with several operational segments offset to either side of the linear function line, and with the operational segment 230 associated with the coarse value of +7 pulled even farther away to illustrate that if the system were to operate just beyond the upper or lower boundary of an operational segment 230, then it would transition into the middle of an adjacent operational segment 230 where it would tend to remain unless and until it operated beyond the upper or lower boundary of the new operational segment.

FIGS. 5 and 6 graphically illustrate how, in the preferred embodiment, coarse values 210 are combined with a fine value range 220 to produce a plurality of operational segments 230 that collectively span the range of N-bit demand values by successively overlapping one another. In the preferred embodiment, there are $2^{N-Y+1}$ (i.e. $2^X$ where X=N−Y+1) operational segments 230 that each contain two coarse segments 240, and that overlap one another by 50 percent, with an endpoint of each operational segment 230 ending near a center of an overlapped operational segment 230. In effect, there are twice as many operational segments 230 as would be required if one tried to span the range of N-bit demand values with segments 230 that are laid out end-to-end. This overlapping relationship ensures that for small changes in the analog output signal 61, as would be the case while track following, the system tends to operate monotonically by maintaining the X-bit command and only varying the Y-bit command. If the system starts operation need the top or bottom of an operational segment 230, once the necessary Y value grows too large, the system falls into the middle of an adjacent operational segment where it has additional room to again operate, monotonically, by maintaining the X-bit command and only varying the Y-bit command.

Note while reviewing these figures that the X-bit command and Y-bit command, taken together, require one more bit of control than the 14-bit resolution that is desired, i.e. X+Y=5+10=15. This "extra" bit provides the 50% overlap illustrated by FIG. 6.

The preferred embodiment of the claimed method is best understood by reviewing the foregoing figures, especially FIG. 2, in conjunction with the flowcharts of FIGS. 7–11. The illustrated embodiment is particularly directed to a method of using a "converter" 12 in the controller 10 (which may be implemented as firmware, or hardware, or both) for converting (a sequence of N-bit demands into analog output signals 61 that drive an actuator motor 80 in a magnetic disk drive using two lower-resolution digital-to-analog converters (DACs) including a first DAC 40 of at least X-bits of resolution that produces a coarse output signal 41 (where X<N) and a second DAC 50 of at least Y-bits of resolution that produces a fine output signal 51 (where Y<N), the method comprising the steps of receiving 100 a new N-bit demand derived from a range of N-bit demand values; converting 110 the new N-bit demand into an X-bit command and a Y-bit command; producing 120 a coarse output signal 41 with the first DAC 40 based on the selected X-bit command; producing 130 a fine output signal 51 with the second DAC 50 based on the calculated Y-bit command; and combining 140 the coarse and fine output signals 41, 51 to produce the analog output signal 61 that drives the actuator motor 80.

Figure 7:
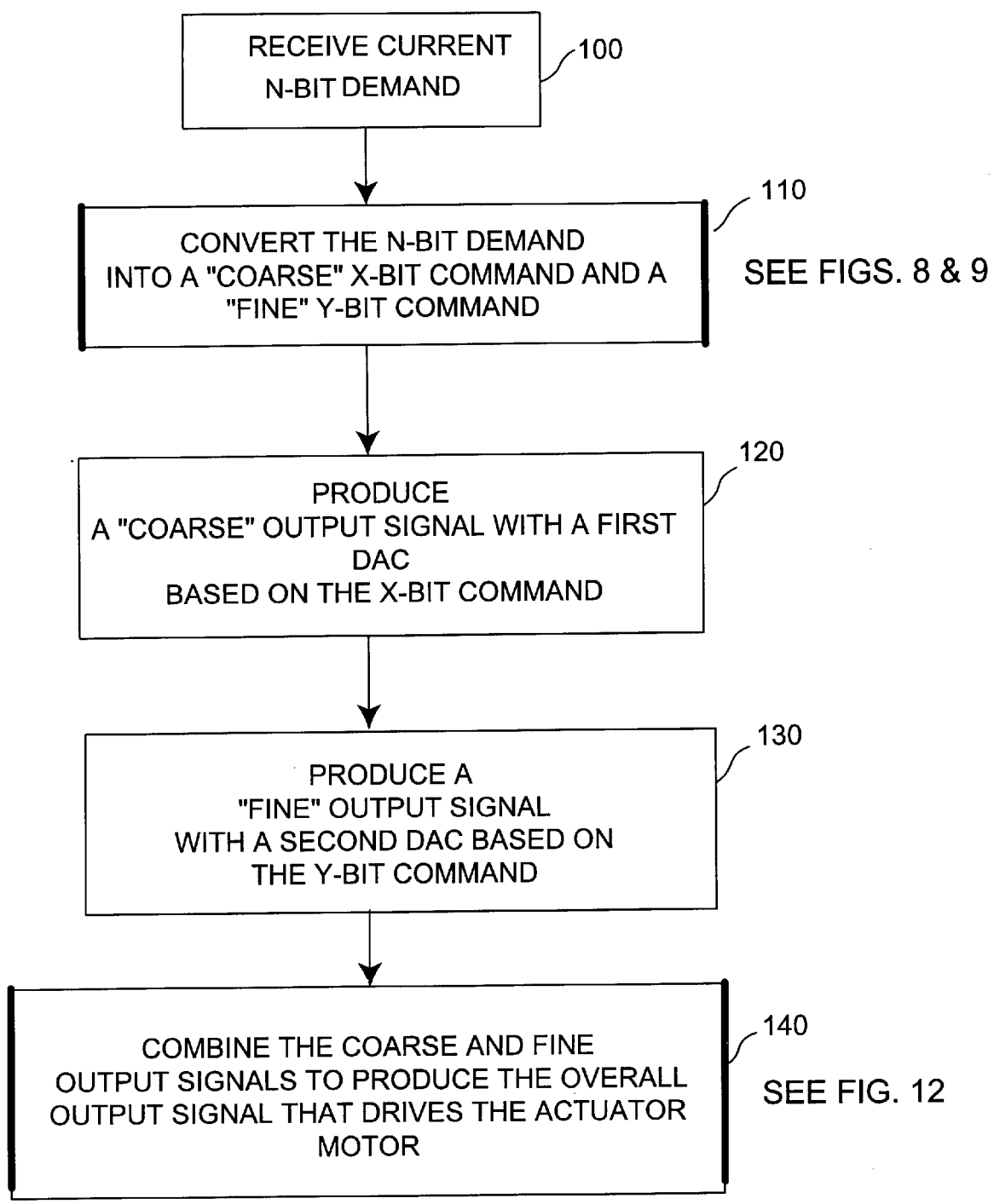
FIG. 7 is a flowchart illustrating a preferred embodiment of controlling the first and second DACs of FIGS. 2–4 to produce an overall analog output signal that drives the VCM.
Figure 8:
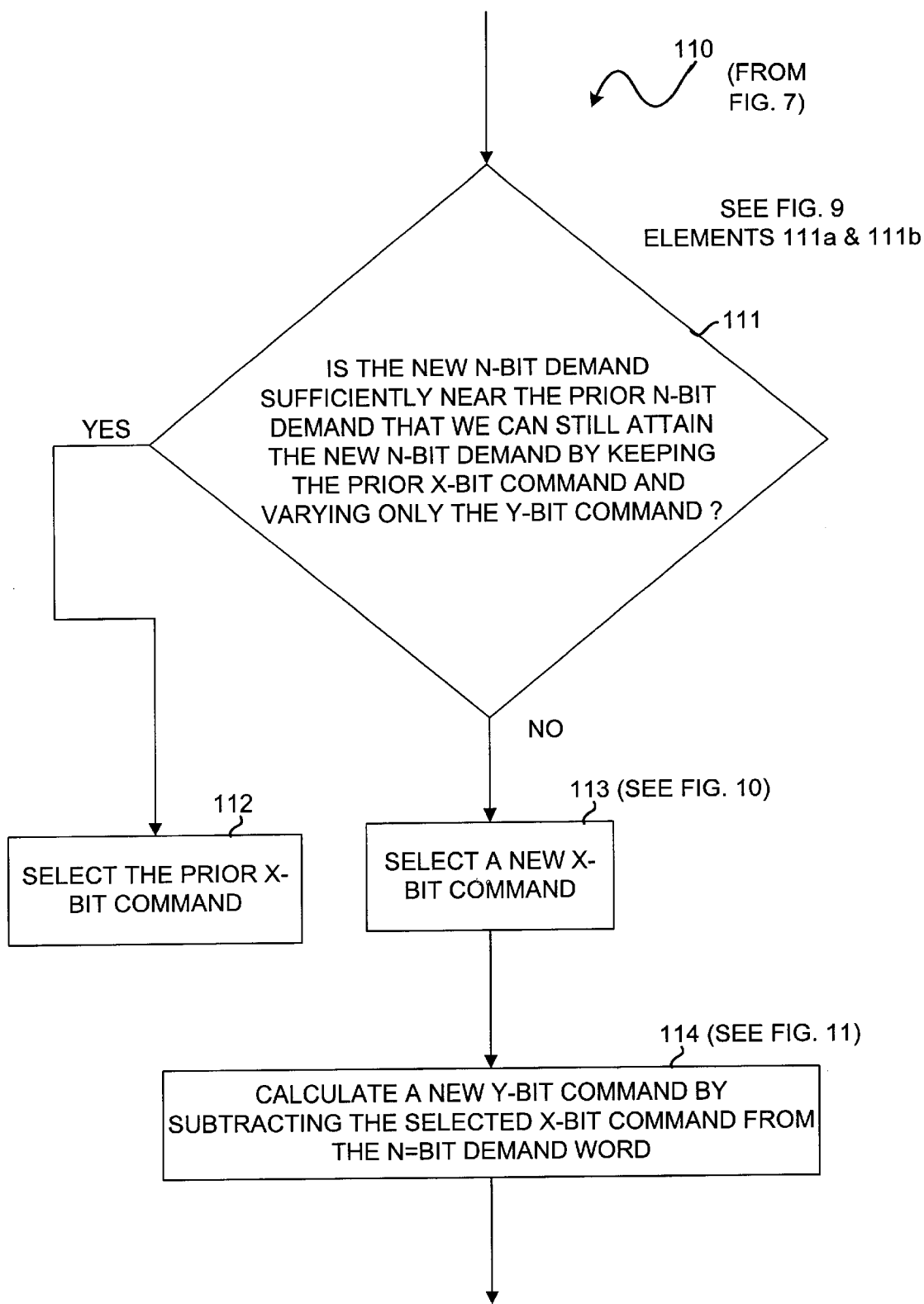
FIG. 8 is a flowchart that generally illustrates a preferred method of implementing the converting step 110 of FIG. 7.
Figure 9:
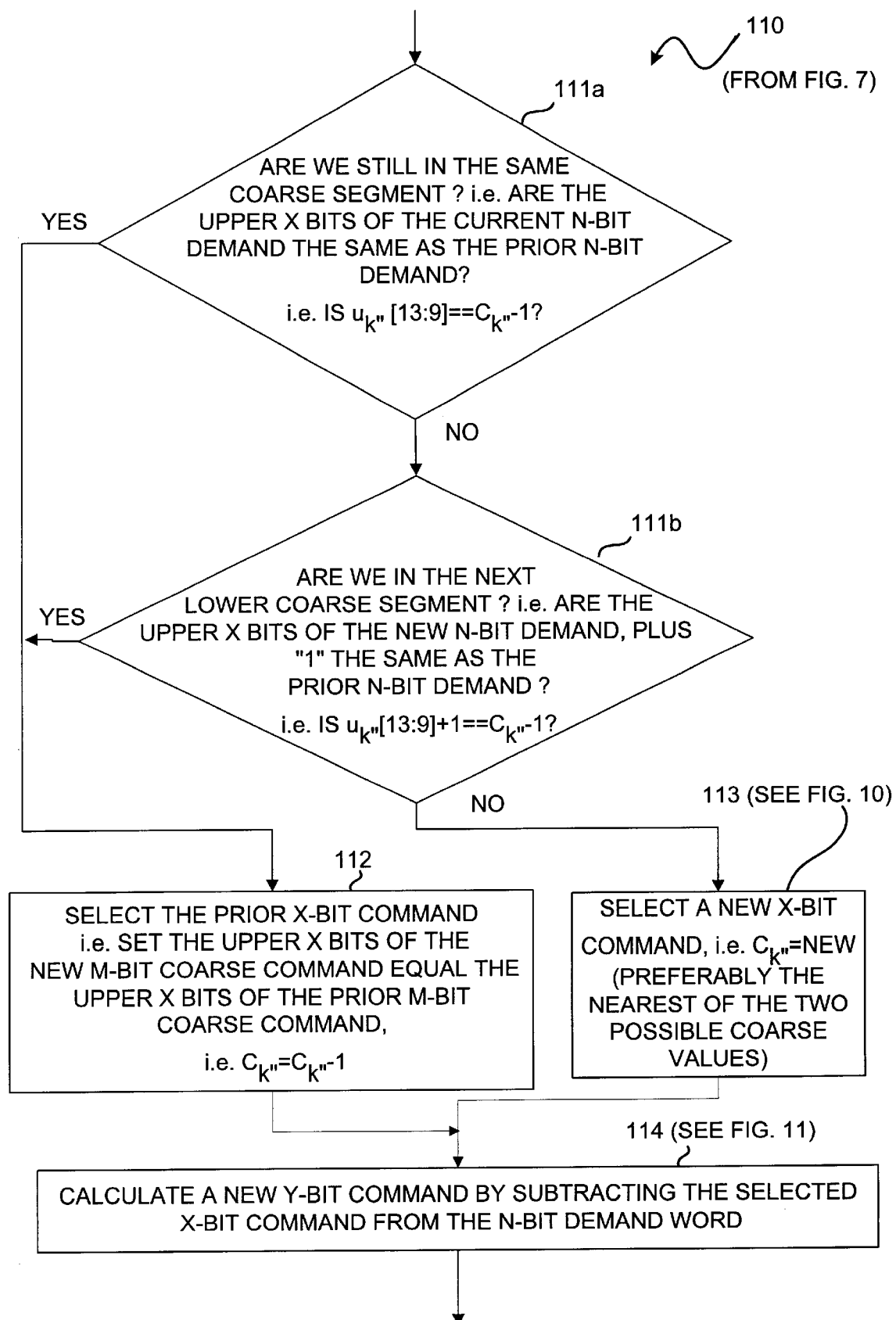
FIG. 9 is a flowchart that more specifically illustrates the preferred method of implementing the converting step 110 of FIG. 7 wherein the substep 111 of FIG. 6 is broken into two component steps 111a and 111b and wherein further details are provided with regard to the operations of substeps 112 and 113.

The converting step 110 of FIG. 7 is shown in more detail in FIGS. 8 and 9. Focusing only FIG. 8 for now, it is shown that the preferred converting step 110 comprises substeps 111, 112, 113, and 114. The substep 111 involves determining if the new N-bit demand is sufficiently near the prior N-bit demand such that the new N-bit demand may be attained by re-using the X-bit command which corresponds to the prior N-bit demand and varying only the Y-bit command. If YES, the method proceeds by selecting 112 the X-bit command corresponding to a prior N-bit demand else, if NO, by selecting 113 a new X-bit command. In either case, after selecting the X-bit command, the method proceeds with the calculating of a new Y-bit command by subtracting the selected X-bit command from the new N-bit demand.

FIG. 9 is similar to FIG. 8 in that it too illustrates the preferred method of implementing the converting step 110 of FIG. 7. Here, however, the substep 111 of FIG. 8 is broken into two component steps 111a and 111b and further details are provided with regard to the operations of substeps 112 and 113. At step 111a, the system checks to see if we are still in the same coarse segment 240 as before by taking the new N-bit demand $Uk_{k''}$, isolating its upper five bits $u_{k''}[13:9]$, and comparing them to the same five bits of the prior N-bit demand $u_{k''-1}$. If YES, i.e. if we are indeed still in the same coarse segment 240, flow proceeds to step 112 where the system selects the prior X-bit command that defines the operational segment 230 containing the coarse segment 240. This selecting step may occur by re-transmitting the X-bit command across the serial interface 20 of FIG. 2, or by simply not updating the prior X-bit command (which is preferred). If NO is the result of step 111a, then the system looks continues to step 111b where it checks to see if the upper X-bits of the new N-bit demand is only one below the prior X-bit command, i.e. is $u_{k''}[13:9]+1==c_{k''-1}$? If YES is the result of step 111b, flow still proceeds to step 112 such that system still uses the prior X-bit command because it can. If NO is the result of step 11b, as would be the case if the host computer issued a seek command and the disk drive is leaving the track follow mode, then flow proceeds to step 113 where the system selects a new X-bit command. As noted parenthetically, and as discussed below with reference to FIG. 10, the preferred method will select the nearest of two possible coarse values. Finally, at step 1114, the system calculates a new Y-bit command by subtracting the selected X-bit command from the N-bit demand word.

Figure 10:
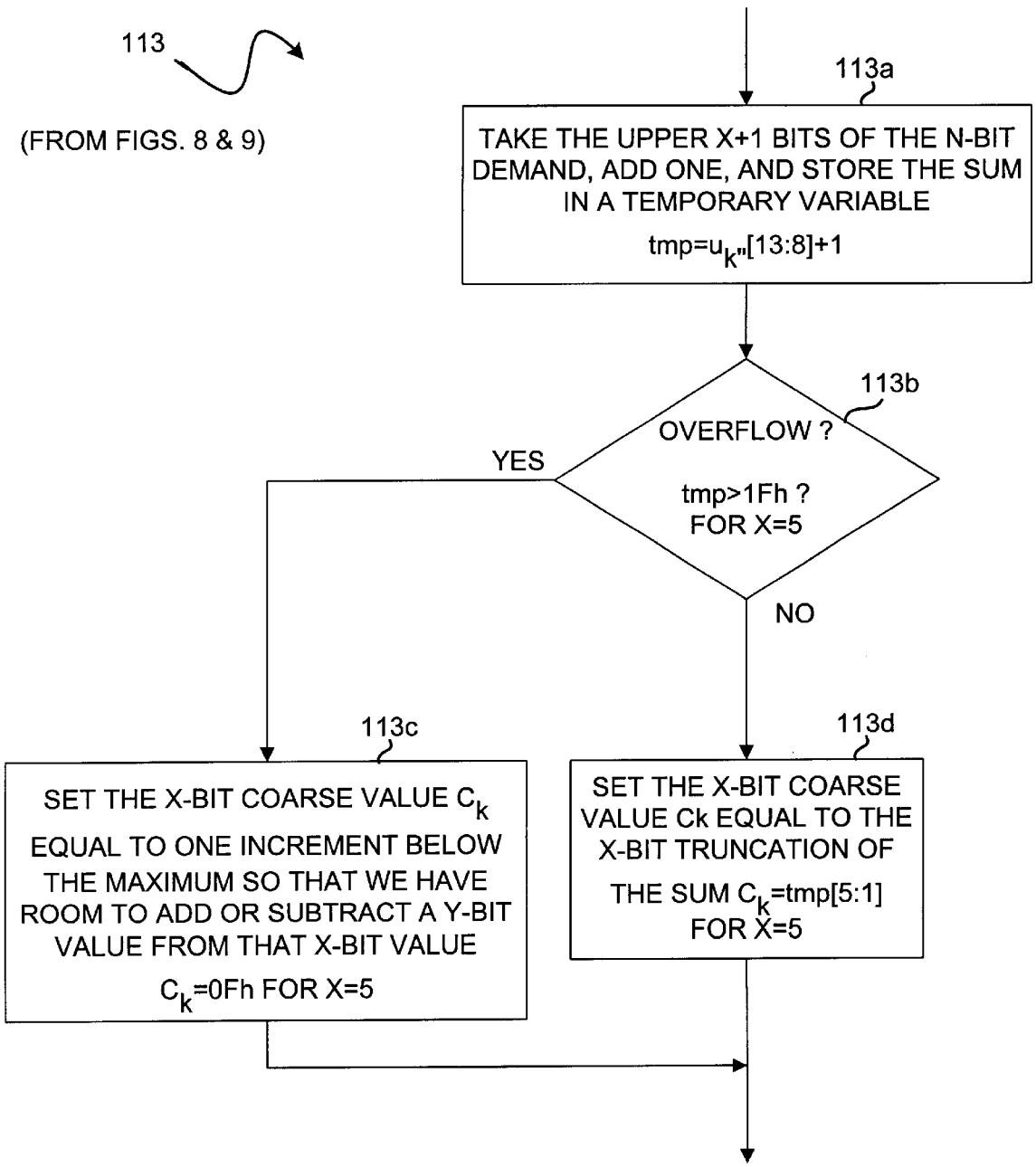
FIG. 10 is a flowchart showing the preferred method of implementing the substep 113 of selecting a new X-bit value from FIGS. 8 and 9.

FIG. 10 is a flowchart showing the details in the preferred method of implementing the substep 113 of selecting a new X-bit value from FIGS. 8 and 9. First, at step 113a, the method takes the upper X+1 bits of the N-bit demand, adds one to it, and stores the sum in a temporary variable called "tmp" At step 113b, the method checks for an overflow condition, i.e. checks to see if the upper 5-bits were [1_1111] by seeing if the most significant bit of the six bits stored in "tmp" was flipped into a one. If YES, the method flows to step 113c where the X-bit coarse value is set to one bit below the maximum so that there is room to deviate to one side or the other using the Y-bit value. If NO, the method flows to step 113d where it sets the X-bit coarse value equal to the X-bit truncation of the sum (i.e. it truncates the overflow check bit).

Figure 11:
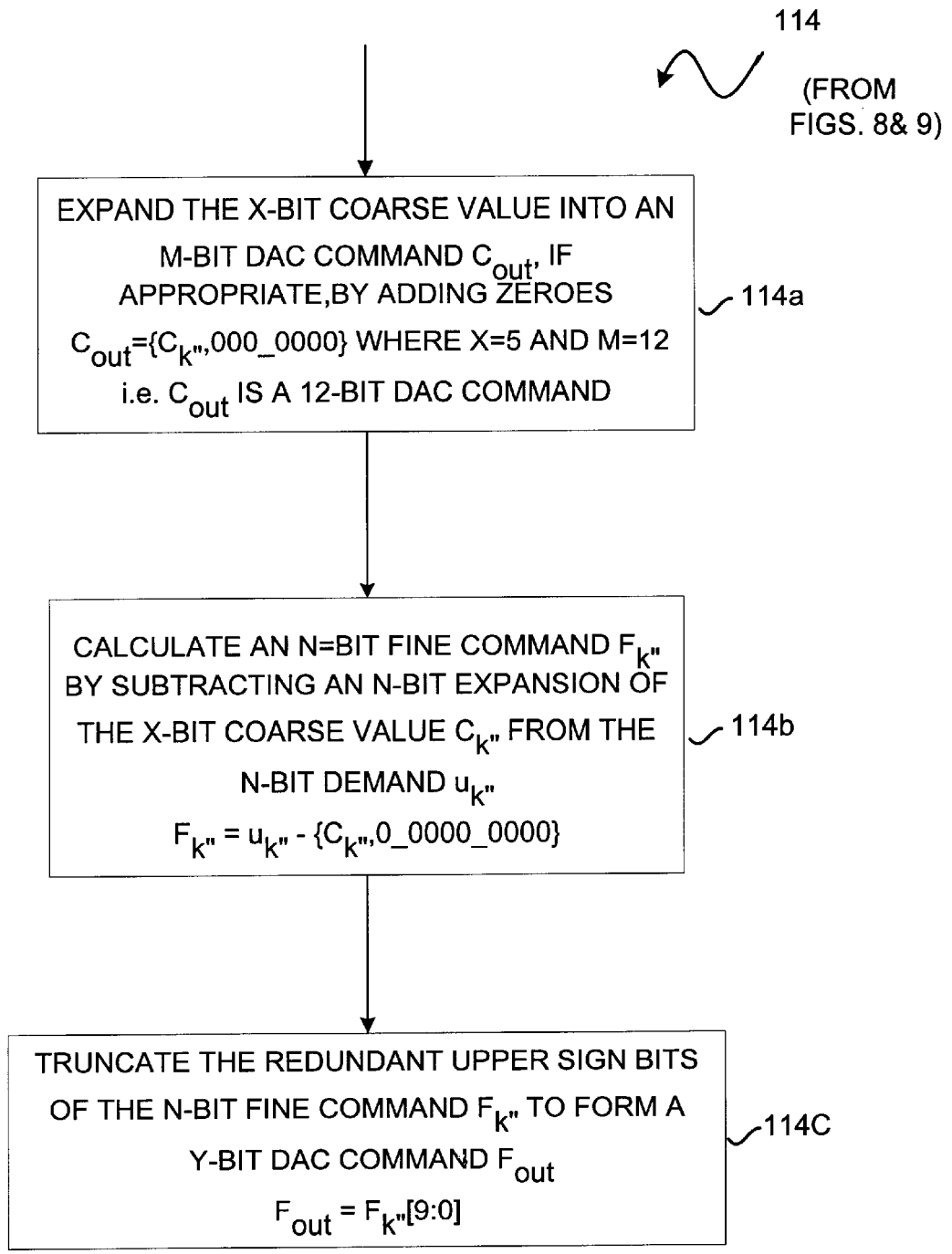
FIG. 11 is a flowchart showing the preferred method of implementing the substep 114 of calculating a new Y-bit command from FIGS. 8 and 9.

FIG. 11 is a flowchart showing the preferred method of implementing the substep 114 of calculating a new Y-bit command from FIGS. 8 and 9. First, at step 114a, the method expands the X-bit coarse value, if appropriate, into an M-bit command $C_{out}$ where M is $\geq$X. In the preferred embodiment, the first DAC 40 is a 12-bit DAC such that seven zeroes are added to the X-bit command value to form a 12-bit DAC command suitable for provision to the first DAC. Next, at step 114b, the method calculates an N-bit fine command $F_{k''}$ by subtracting an N-bit expansion of the X-bit coarse value $C_{k''}$ from the N-bit demand. Lastly, the method truncates the upper sign bits of the N-bit fine command $F_{k''}$ to form a Y-bit DAC command $F_{out}$ suitable for provision to the second DAC.

Figure 4:
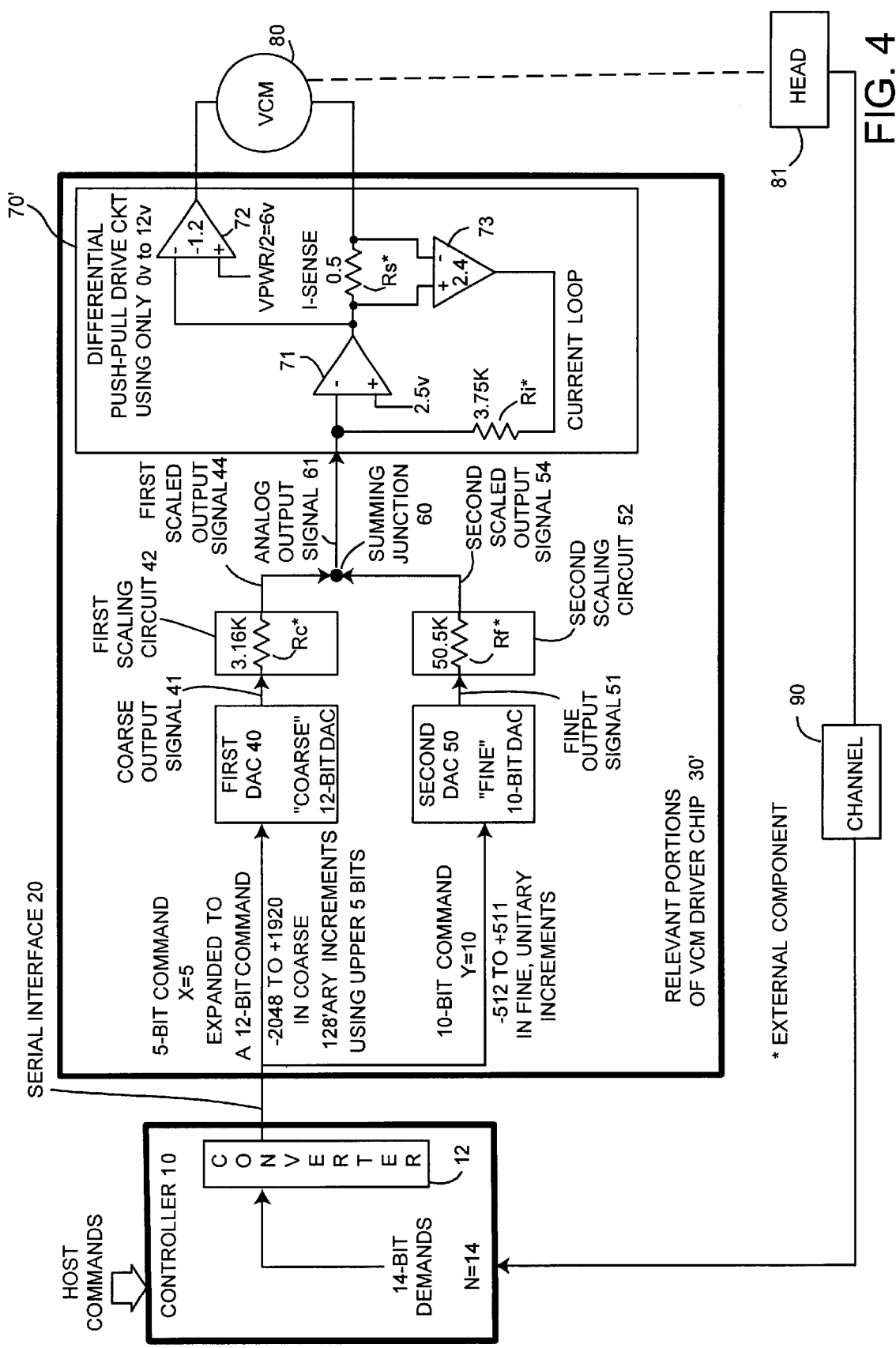
FIG. 4 is a block diagram that expands on FIGS. 2 and 3 and provides details regarding first and second scaling circuits and a differential push-pull drive circuit that are used in the preferred embodiment.
Figure 12:
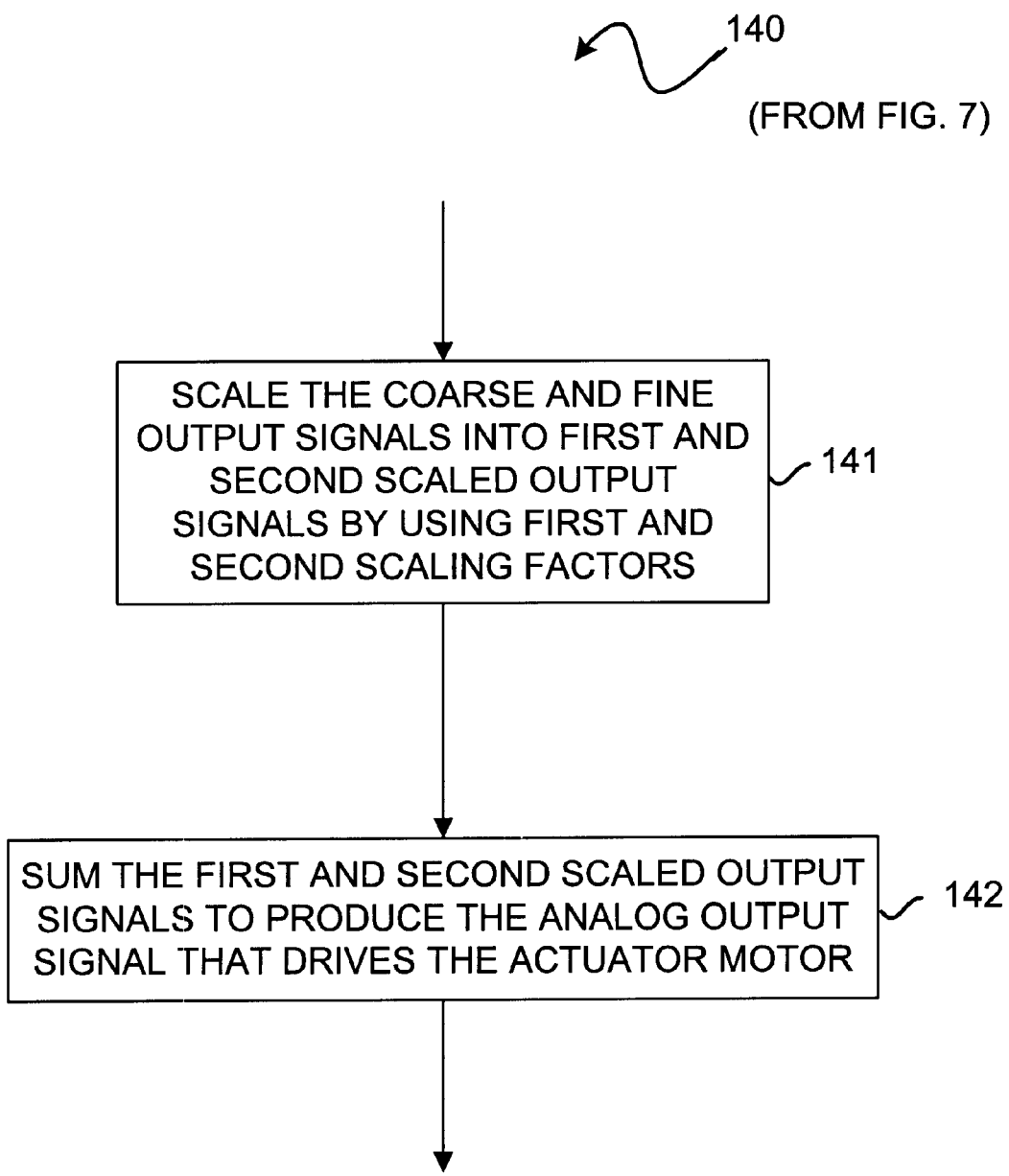
FIG. 12 is a flowchart showing a preferred method of implementing the combining step 140 of FIG. 7.

FIG. 12 is a flowchart showing a preferred method of implementing the combining step 140 of FIG. 7. The combining step 140 is accomplished in two sub-steps. In particular, the preferred combining process 140 is accomplished by scaling the coarse and fine output signals 41, 51 into first and second scaled output signals 44, 54 by using first and second scaling factors (step 141); and then summing the first and second scaled output signals 44, 54 to produce the analog output signal 61 that drives the actuator motor. The first and second scaling factors are based on a mathematical relationship between Y and N. As shown in FIG. 3, the scalings of the coarse and fine output signals are preferably accomplished with first and second scaling circuits 42, 52 which, as shown in FIG. 4, preferably comprise first and second scaling resistors $R_c$ and $R_f$. The scaling resistors, as described more fully below, preferably have resistance values that are provided in a ratio of $1:(2^{N-Y})$, i.e. 1:16 where N=14 and Y=10.

In order to provide the overlap described above and shown graphically in FIG. 6, it is further preferred that X is equal to N−Y+1 such that there are $2^{N-Y+1}$ possible X-bit commands and $2^{N-Y+1}$ operational segments that are each defined by a locus of commands corresponding to one of the $2^{N-Y+1}$ possible X-bit commands and a set of $2^Y$ Y-bit commands. In such case, the first and second scaling factors are preferably provided in a ratio of $1:(2^{N-Y})$ so that the $2^{N-Y+1}$ operational segments collectively span the range of N-bit demand values by successively overlapping one another by 50 percent, with an endpoint of each operational segment ending near a center of an overlapped operational segment, all as shown in FIG. 6. In the embodiment shown, the first and second scaling factors are provided a ration of 1:16, i.e. $1:(2^{14-10})=2^4$, and there are 32 operational segments, i.e. $2^{14-10+1}=2^5$, but other numeric relationships are possible depending on the number of bits N in the demand and the number of bits Y used for the second, fine DAC 50. It is also possible, of course, to provide something other than a 50% overlapping relationship between the operational segments 230.

Turning back to FIG. 4, with the operational details of the preferred embodiment now in hand, one sees a block diagram of the system that is controlled with such method. FIG. 4, in particular, expands on FIGS. 2 and 3 and shows that the first coarse and the second fine scaling circuits 42, 52 are formed from scaling resistors $R_c$ and $R_f$, respectively, and that the preferred drive circuit 70 is a differential push-pull drive circuit formed from a plurality of operational amplifiers 71, 72, 73, a current sense resistor $R_s$, and a current feedback resistor $R_i$.

Recall from FIG. 5 that our output voltage from our DACs is 2.5 volts, ±1 volt. The output voltage, in other words, varies from 1.5 volts to 3.5 volts, with the center value of 00_0000_0000_0000 equal to 2.5 volts. In addition, we want to provide the VCM 80 with 1 amp of drive when the first DAC 40 is at full scale to either side of the center value. The value of resistor $R_c$ is chosen arbitrarily except for the requirement that it be above a certain resistance value to ensure that we do not draw too much current from the first DAC 40. We choose 3.16K for $R_c$. The current sense resistor $R_s$ is 0.5 ohms, a value that is about twenty times smaller than the VCM's internal resistance so that it has little effect on the operation of the overall circuit.

As shown in FIG. 4, we amplify the voltage developed across the current sense resistor $R_s$ with an operational amplifier. We configure the opamp to provide a gain of 2.4 so that, if we see the maximum output voltage of 1 volt above the center voltage from the first DAC 40 and have full current drive at 1 amp, we apply 1.2 volts above the center voltage to the top of the current feedback resistor $R_i$. The value of the current feedback resistor $R_i$ is chosen such that with 1.2 volts above center coming out of opamp 73, the current through Ri is the same as the current through $R_c$ with 1.0 volt above center coming out of the first DAC 40. As such, the value of $R_i$ is 3.75K.

Lastly, $R_f$ is set to be sixteen times as large as $R_c$ because we need to scale for sixteen even though we actually use thirty-two operational segments 230 that overlap by 50%. As such, $R_c$ is set to 16×3.16K, or 50.5K.

The preferred embodiment of FIG. 4 uses voltage DAC's and resistors to accomplish the scaling, but current DAC's may also be used and other more complex approaches to scaling the outputs 41, 51 of the first and second DACs 40, 50 may be employed with equal utility. The scaling feature, moreover, may be integral to the DAC's themselves.

We claim:

1. A method of converting a sequence of N-bit demands into analog output signals that drive an actuator motor in a magnetic disk drive using two lower-resolution digital-to-analog converters (DACS) including a first DAC of at least X-bits of resolution that produces a coarse output signal (where X<N) and a second DAC of at least Y-bits of resolution that produces a fine output signal (where Y<N), the method comprising the steps of:

receiving (100) a new N-bit demand derived from a range of N-bit demand values;

converting (120) the new N-bit demand into an X-bit command and a Y-bit command by:

selecting (112) the X-bit command corresponding to a prior N-bit demand if the new N-bit demand is near enough to the prior N-bit demand such that the new N-bit demand may be attained by re-using the X-bit command which corresponds to the prior N-bit demand and varying the Y-bit command (111, or 11a & 11b); else selecting (113) a new X-bit command, and subtracting (114) the selected X-bit command from the new N-bit demand to calculate a new Y-bit command;

producing a coarse output signal with the first DAC based on the selected X-bit command;

producing a fine output signal with the second DAC based on the calculated Y-bit command; and combining (140) the coarse and fine output signals to produce the analog output signal that drives the actuator motor.

2. The method of claim 1 wherein the combining step is accomplished by:

scaling the coarse and fine output signals into first and second scaled output signals by using first and second scaling factors; and summing the first and second scaled output signals to produce the analog output signal that drives the actuator motor.

3. The method of claim 2 wherein the scalings of the coarse and fine output signals are accomplished with first and second scaling circuits.

4. The method of claim 3 wherein the first and second scaling circuits comprise first and second resistors.

5. The method of claim 4 the first and second resistors have resistance values that are provided in a ratio of $1:(2^{N-Y})$.

6. The method of claim 2 wherein the first and second scaling factors are based on a mathematical relationship between Y and N.

7. The method of claim 6 wherein X is equal to N−Y+1 such that there are $2^{N-Y+1}$ possible X-bit commands and $2^{N-Y+1}$ operational segments that are each defined by a locus of commands corresponding to one of the $2^{N-Y+1}$ possible X-bit commands and a set of $2^Y$ Y-bit commands.

8. The method of claim 7 wherein the first and second scaling factors are provided in a ratio of $1:(2^{N-Y})$ so that the $2^{N-Y+1}$ operational segments collectively span the range of N-bit demand values by successively overlapping one another by 50 percent, with an endpoint of each operational segment ending near a center of an overlapped operational segment.

9. The method of claim 8 wherein N=14 such that the N-bit demands are 14-bit demands, wherein X=5 and the first DAC has at least 5-bits of resolution; and wherein Y=10 and the Y-bit DAC has 10-bits of resolution, such that there are 32 ($2^{*14-10+1}=2^5=32$) operational segments, and such that the first and second scaling factors are provided in a ratio of 1:16 (i.e. $1:2^{14-10}=1:2^4=1:16$).

10. The method of claim 1 wherein the step of selecting a new X-bit command is accomplished by selecting a nearest of two X-bit commands that correspond to values surrounding the new N-bit demand.

11. The method of claim 1 wherein the step of selecting (112) the X-bit command corresponding to the prior N-bit demand if the new N-bit demand is near enough to the prior N-bit demand that the new N-bit demand may be attained by varying only the Y-bit command (111, or 11a & 11b) is accomplished by:
   selecting the prior X-bit command if an upper X-bits of the new N-bit demand are the same as the upper X-bits of the prior N-bit demand (111a); else
   selecting the prior X-bit command, less "1", if the upper X-bits of the new N-bit demand, plus "1", are the same as the upper X-bits of the prior N-bit demand (111a).

12. The method of claim 1 wherein the first DAC has M-bits of resolution (M>X) and wherein the step of producing a coarse output signal comprises the step of converting the X-bit command to an M-bit value for provision to the first DAC.

13. The method of claim 12 wherein the step of converting the X-bit command to an M-bit value for provision to the first DAC is accomplished by appending (M-X) trailing zeroes to the X-bit command.

14. The method of claim 1 wherein N=14, X=12, Y=10, and M=5.

15. The method of claim 1 wherein the N-bit demands, the X-bit command, and the Y-bit command are digitally represented in 2's complement notation.

16. The method of claim 1 wherein the X- and Y-bit DACs are formed from strings of coarse and fine resistive elements.

17. The method of claim 1 wherein the converting step is accomplished in a converter.

18. The method of claim 17 wherein the converter, the first DAC, and the second DAC are provided in a single semiconductor device.

19. The method of claim 17 wherein the converter is provided in a first semiconductor device that uses relatively small process geometries suitable for high gate density and wherein the first and second DAC's are provided in a second semiconductor device that uses relatively large process geometries suitable for power devices, the method comprising the further step of communicating the X-bit and Y-bit commands from the controller in the first semiconductor device to the first and second DAC's in the second semiconductor device.

20. A method of converting a sequence of N-bit demands into analog output signals that drive an actuator motor in a magnetic disk drive using two lower-resolution digital-to-analog converters (DACs) including a first DAC of at least X-bits of resolution that produces a coarse output signal (where X<N) and a second DAC of at least Y-bits of resolution that produces a fine output signal (where Y<N), the method comprising the steps of:
   (a) receiving (100) a new N-bit demand derived from a range of N-bit demand values;
   (b) converting (120) the new N-bit demand into an X-bit command and a Y-bit command wherein X is equal to N−Y+1 such that there are $2^{N-Y+1}$ possible X-bit commands and $2^{N-Y+1}$ operational segments that are each defined by a locus of commands corresponding to one of the $2^{N-Y+1}$ possible X-bit commands and a set of $2^Y$ Y-bit commands, the converting step including the sub-steps of:
      (i) selecting (112) the X-bit command corresponding to a prior N-bit demand if the new N-bit demand is near enough to the prior N-bit demand such that the new N-bit demand may be attained by re-using the X-bit command that corresponds to the prior N-bit demand and varying the Y-bit command (111, or 11a & 11b); else selecting (113) a new X-bit command, and
      (ii) subtracting (114) the selected X-bit command from the new N-bit demand to calculate a Y-bit command;
   (c) producing (120) a coarse output signal with the first DAC based on the selected X-bit command;
   (d) producing (120) a fine output signal with the second DAC based on the calculated Y-bit command;
   (e) scaling (included in 140) the coarse and fine output signals into first and second scaled output signals by using first and second scaling factors that are provided in a ratio of $1:2^{N-Y}$ so that the $2^{N-Y+1}$ operational segments collectively span the range of N-bit demand values by successively overlapping one another by 50 percent, with an endpoint of each operational segment ending near a center of an overlapped operational segment; and
   (f) summing (included in 140) the first and second scaled output signals together to produce the analog output signal that drives the actuator motor.

21. The method of claim 20 wherein the scalings of the coarse and fine output signals are accomplished with first and second scaling circuits.

22. The method of claim 21 wherein the first and second scaling circuits comprise first and second resistors.

23. The method of claim 22 the first and second resistors have resistance values that are provided in a ratio of $1:(2^{N-Y})$.

24. The method of claim 20 wherein N=14 such that the N-bit demands are 14-bit demands, wherein X=5 and the first DAC has at least 5-bits of resolution; and wherein Y=10 and the Y-bit DAC has 10-bits of resolution, such that there are 32 ($2^{*14-10+1}=2^5=32$) operational segments, and such that the first and second scaling factors are provided in a ratio of 1:16 (i.e. $1:21^{14-10}=1:2^4=1:16$).

25. The method of claim 20 wherein the step of selecting a new X-bit command is accomplished by selecting a nearest of two X-bit commands that correspond to values surrounding the new N-bit demand.

26. The method of claim 20 wherein the step of selecting (112) the X-bit command corresponding to the prior N-bit demand if the new N-bit demand is near enough to the prior N-bit demand that the new N-bit demand may be attained by varying only the Y-bit command (111, or 11a & 11b) is accomplished by:
   selecting the prior X-bit command if an upper X-bits of the new N-bit demand are the same as the upper X-bits of the prior N-bit demand (111a); else
   selecting the prior X-bit command, less "1", if the upper X-bits of the new N-bit demand, plus "1", are the same as the upper X-bits of the prior N-bit demand (111a).

27. The method of claim 20 wherein the first DAC has M-bits of resolution (M>X) and wherein the step of producing a coarse output signal comprises the step of converting the X-bit command to an M-bit value for provision to the first DAC.

28. The method of claim 27 wherein the step of converting the X-bit command to an M-bit value for provision to the first DAC is accomplished by appending (M-X) trailing zeroes to the X-bit command.

29. The method of claim 20 wherein N=14, X=12, Y=10, and M=5.

30. The method of claim 20 wherein the N-bit demands, the X-bit command, and the Y-bit command are digitally represented in 2's complement notation.

31. The method of claim 20 wherein the X- and Y-bit DACs are formed from strings of coarse and fine resistive elements.

32. The method of claim 20 wherein the converting step is accomplished in a converter.

33. The method of claim 32 wherein the converter, the first DAC, and the second DAC are provided in a single semiconductor device.

34. The method of claim 32 wherein the converter is provided in a first semiconductor device that uses relatively small process geometries suitable for high gate density and wherein the first and second DAC's are provided in a second semiconductor device that uses relatively large process geometries suitable for power devices, the method comprising the further step of communicating the X-bit and Y-bit commands from the controller in the first semiconductor device to the first and second DAC's in the second semiconductor device.

* * * * *